(12) United States Patent
Lee et al.

(10) Patent No.: US 11,266,034 B1
(45) Date of Patent: Mar. 1, 2022

(54) INTERFACE SYSTEM FOR FUNCTIONAL MODULE AND FUNCTIONAL MODULE THEREOF

(71) Applicant: SHUTTLE INC., Taipei (TW)

(72) Inventors: Hsiao-Hui Lee, Taipei (TW); Hung-Lin Chang, Taipei (TW)

(73) Assignee: SHUTTLE INC., Taipei (TW)

( * ) Notice: Subject to any disclaimer, the term of this patent is extended or adjusted under 35 U.S.C. 154(b) by 0 days.

(21) Appl. No.: 17/090,889

(22) Filed: Nov. 6, 2020

(30) Foreign Application Priority Data

Aug. 26, 2020 (TW) .................. 109129149

(51) Int. Cl.
*H05K 7/00* (2006.01)
*H05K 7/14* (2006.01)
*H05K 1/11* (2006.01)
*H05K 1/14* (2006.01)

(52) U.S. Cl.
CPC ............ *H05K 7/1435* (2013.01); *H05K 1/11* (2013.01); *H05K 1/141* (2013.01)

(58) Field of Classification Search
CPC ......... H05K 7/1435; H05K 1/11; H05K 1/141
See application file for complete search history.

(56) References Cited

U.S. PATENT DOCUMENTS 8,550,824 B2 * 10/2013 Wu ..................... H05K 1/142
439/62
9,436,234 B1 * 9/2016 Felton .................. H05K 7/1445

2007/0197056 A1 * 8/2007 Huang ................... G06F 1/185
439/74
2008/0022028 A1 * 1/2008 Yin ....................... G06F 1/185
710/301

FOREIGN PATENT DOCUMENTS

| CN | 1306232 A | 8/2001 | |
| TW | 201337637 A | 9/2013 | |
| TW | I497308 B | 8/2015 | |
| WO | WO-0126189 A1 * | 4/2001 | ........... H01R 31/005 |

OTHER PUBLICATIONS

Office Action dated Jan. 19, 2021 of the corresponding Taiwan patent application No. 109129149.

* cited by examiner

*Primary Examiner* — Pete T Lee
(74) *Attorney, Agent, or Firm* — Chun-Ming Shih; HDLS IPR SERVICES

(57) ABSTRACT

An interface system for functional module and a functional module thereof are provided. The interface system for the functional module includes a main system and a plurality of functional modules. The main system has a mother board. Each of the functional modules has a circuit board, and at least one functional element disposed on the circuit board, and the functional element is an element having various functions and specifications. An expansion assembly is disposed between the mother board of the main system and the circuit board of any of the functional modules, and the expansion assembly is also disposed between the circuit boards of the functional modules. The main system is selectively and electrically connected to the functional modules through each of the expansion assemblies to be connected extendedly.

10 Claims, 6 Drawing Sheets

INTERFACE SYSTEM FOR FUNCTIONAL MODULE AND FUNCTIONAL MODULE THEREOF

BACKGROUND OF THE INVENTION

Field of the Invention

The present invention relates to an electrical expansion assembly, especially to an interface system for a functional module and a functional module thereof.

Description of Related Art

A mother board in a conventional electronic device is provided with preset circuits and required electronic elements before being dispatched out from a factory for a purpose of satisfying preset functions.

However, there is a trend of allowing the electronic device to be flexible so as to provide an adjustable function to a product having different requirements, thus there are many designs of mother boards for matching various requirements and specifications, and a problem of having excessive stock is caused, meanwhile the components being replaceable cannot be provided due to being limited by the amount of production specifications, thereby unable to achieve an objective of customizing.

Accordingly, the applicant of the present invention has devoted himself for improving the mentioned disadvantages.

SUMMARY OF THE INVENTION

The present invention is to provide an interface system for a functional module and a functional module thereof, in which a modular design is adopted for assembling required functional modules, thereby achieving an objective of customizing.

Accordingly, the present invention provides an interface system for a functional module, which includes a main system and a plurality of functional modules, the main system has a mother board, each of the functional modules has an circuit board and at least one functional element disposed on the circuit board, and the functional element of each of the functional modules is an element having various functions or specifications; wherein, an expansion assembly is disposed between the mother board of the main system and the circuit board of any of the functional modules, the expansion assembly is also disposed between the circuit boards of the functional modules, and each of the expansion assemblies has an input connector and an output connector, the input connector and the output connector are mutually engaged by a plurality of and the same amount of pins disposed respectively on the input connector and the output connector, the main system is selectively and electrically connected to each of the functional modules through the expansion assemblies to be connected extendedly (for example, connected extendedly in series).

Accordingly, the present invention provides a functional module, which can be selectively and electrically connected to a main system, and includes a circuit board and at least one functional element disposed on the circuit board, wherein an expansion assembly is disposed on the circuit board, the expansion assembly has an input connector and an output connector, the input connector and the output connector are mutually engaged by a plurality of and the same amount of pins disposed respectively on the input connector and the output connector, the expansion assembly and the main system are able to be connected for expansion.

DETAILED DESCRIPTION OF THE INVENTION

An embodiment of the present invention will be described with reference to the drawings. These are, of course, merely examples and are not intended to be limiting.

Figure 1:
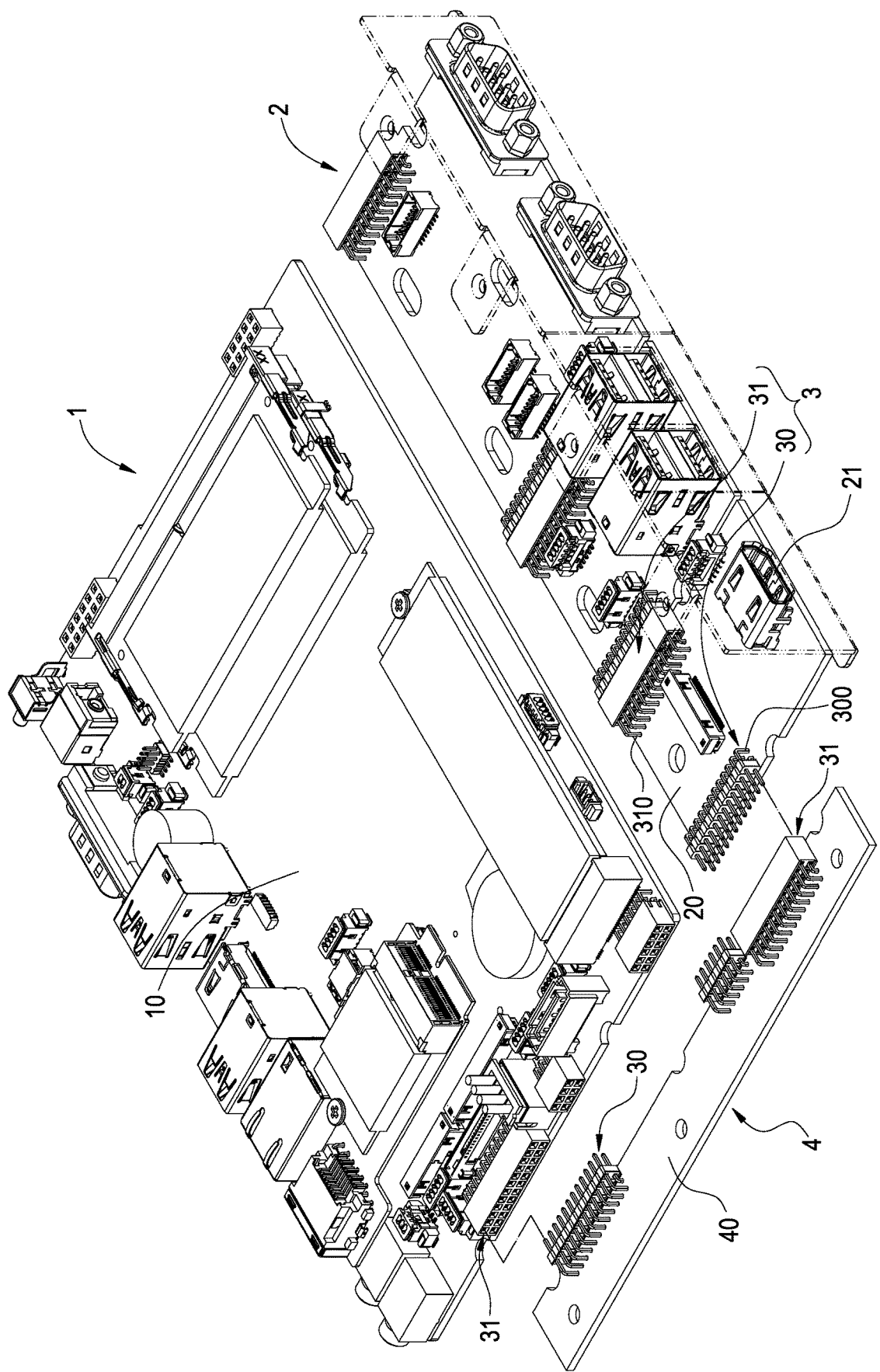
FIG. 1 is a perspective exploded view showing an interface system for a functional module according to the present invention.
Figure 2:
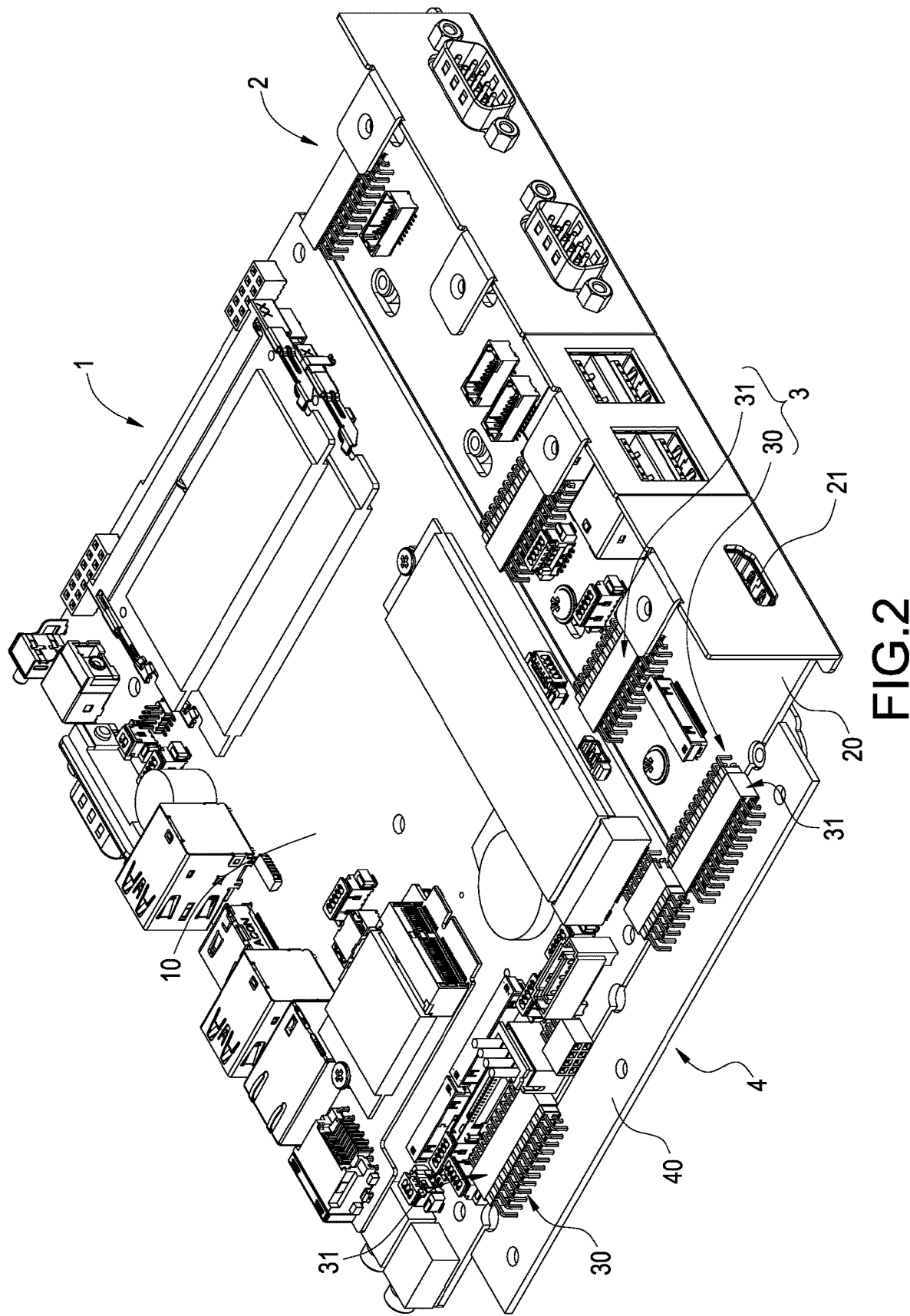
FIG. 2 is a perspective view showing the assembly of the interface system for the functional module according to the present invention.

Please refer from FIG. 1 and FIG. 2, wherein FIG. 1 is a perspective exploded view showing an interface system for a functional module according to the present invention; and FIG. 2 is a perspective view showing the assembly of the interface system for the functional module according to the present invention. The present invention provides an interface system for a functional module and a functional module thereof, which can be applied in various types of electronic devices 5 and served to provide functions such as internal or external connecting and expanding. The interface system for the functional module includes a main system 1 and a plurality of functional modules 2.

Figure 4:
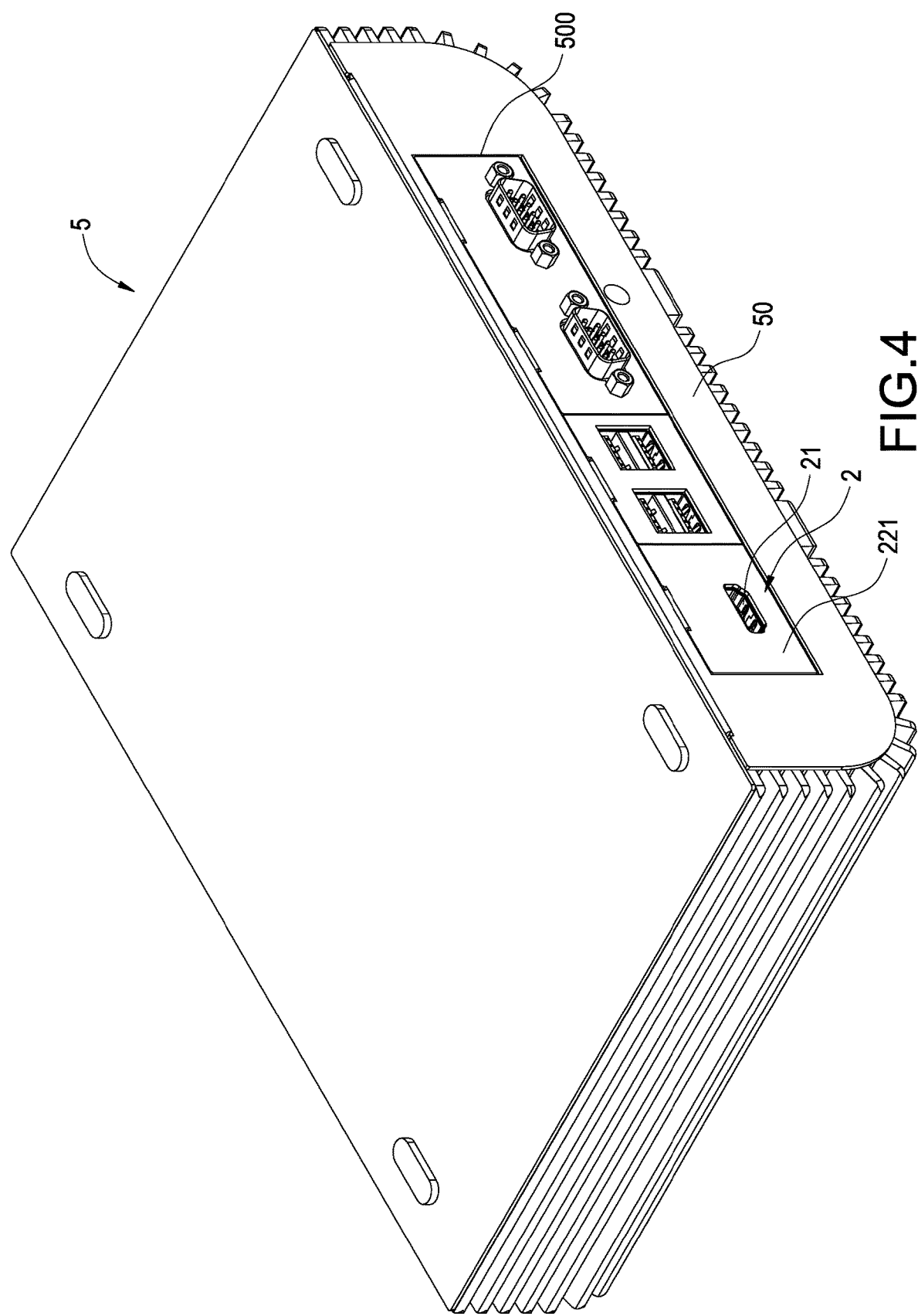
FIG. 4 is a schematic view showing an operating status of the present invention being applied in an electronic device.

The main system 1 has a mother board 10 and a plurality of electronic elements disposed on the mother board 10 so as to provide functions required by the main system 1. The main system 1 can be a main component, for example, a circuit board, disposed in the electronic device 5 (as shown in FIG. 4); according to this embodiment, the electronic device 5 is a set top box and has at least one arranging surface 50 used for being externally connected or operated, so that a functional element 21 of each of the functional modules 2 can be transversally arranged on the arranging surface 50.

The functional modules 2 can be selectively and electrically connected to the main system 1, and each of the functional modules 2 has a circuit board 20 and at least one functional element 21 disposed on the circuit board 20. Please refer to FIG. 3, each of the functional modules 2 can be provided with the functional element 21 having different functions or specifications, thereby providing functions or interface arrangements required by the main system 1, for example being adopted as female end of various connectors or control buttons, or being adopted as light emitting diodes for providing a signal displaying function of the main system 1. Each of the functional modules 2 further has a carrier 22, the carrier 22 has a carrying plate 220 for allowing the circuit board 20 to be stacked thereon, and has an interface plate 221 arranged in a vertical manner relative to the carrying plate 220 and allowing the functional element 21 to be exposed thereon, the interface plate 221 has a hole 221a allowing the functional element 21 to be exposed, and one side of the carrying plate 220 is protruded with a protruding point 220a allowing each of the functional modules 2 to be in contact with each other while being arranged side-by-side (or in parallel).

Figure 3:
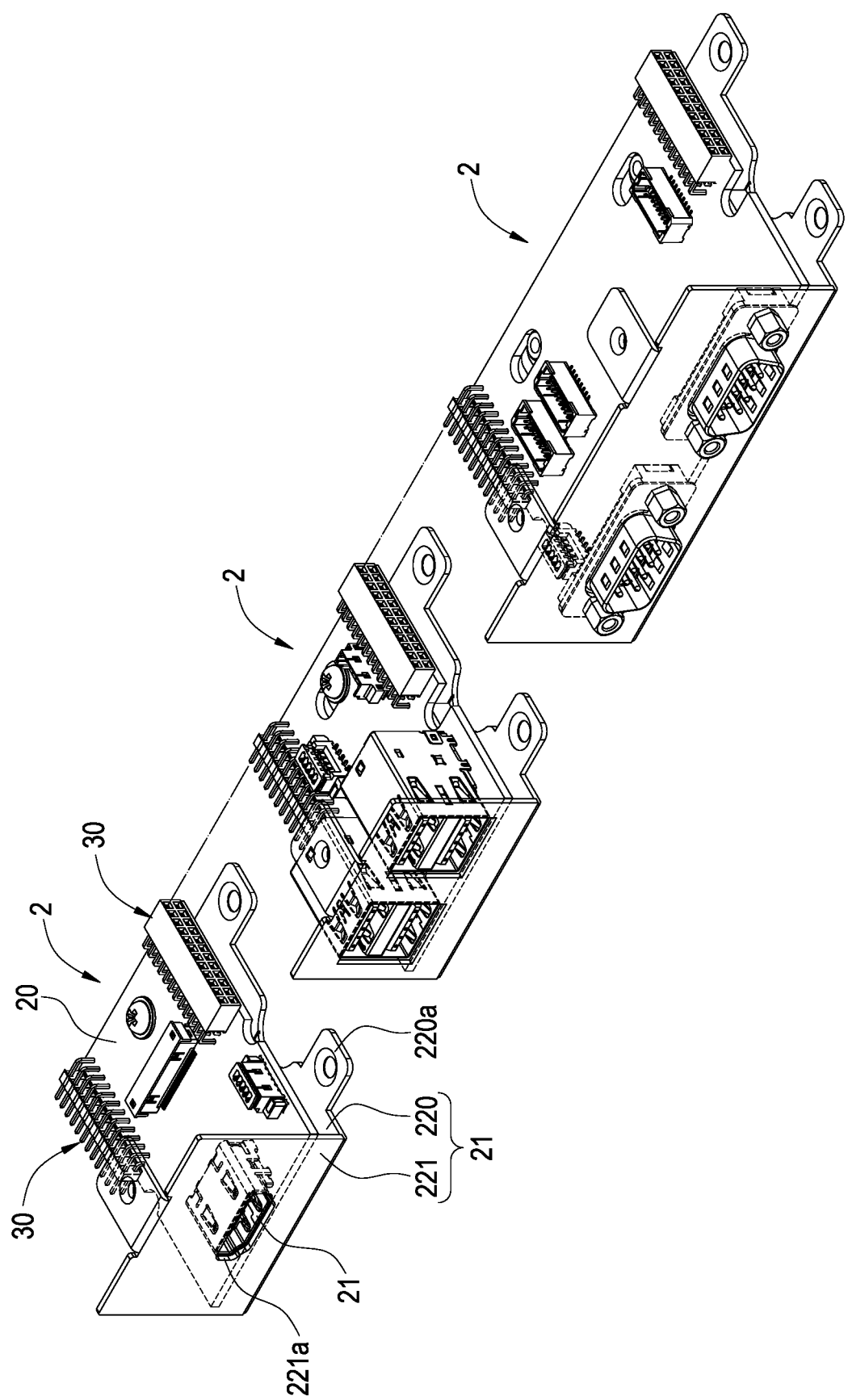
FIG. 3 is a perspective exploded view showing the functional modules according to the present invention.

As shown from FIG. 1 to FIG. 3, according to the present invention, the interface system for the functional module is to utilize a plurality of expansion assemblies 3 to electrically connect the main system 1 and the functional modules 2 for being connected extendedly, each of the expansion assemblies 3 has an input connector 30 and an output connector 31, the input connector 30 has a plurality of input pins 300, and the output connector 31 has a plurality of output pins 310, wherein the amount of the output pins 310 is corresponding to the amount of the input pins 300, the input connector 30 and the output connector 31 are respectively disposed on the mother board 10 of the main system 1 and the circuit board 20 of the functional module 2, so that the input connector 30 and the output connector 31 can be mutually connected for achieving an objective of electrically connecting the main system 1 and the functional module 2, and the main system 1 is provided with an expanding function through the functional element 21 of each of the functional modules 2.

Moreover, under a situation of an arrangement space being limited, a turning plate 4 can be further disposed between the mother board 10 of the main system 1 and the circuit board 20 of the functional module 2 for changing directions and locations of the arrangement. The turning plate 4 has an engaging circuit board 40 for allowing the input connector 30 and the output connector 31 of the expansion assembly 30 to be disposed on the engaging circuit board 40, so as the input connector 30 and the output connector 31 are inserted and connected to the output connector 31 disposed on the mother board 10 of the main system 1 and the input connector 30 disposed on the circuit board 20 of the functional module 2.

Accordingly, with the above-mentioned structure, the interface system for the functional module and the functional module thereof of the present invention can be provided.

Please refer to FIG. 4, which is a schematic view showing an operating status of the present invention being applied in an electronic device 5, for example the set top box. The arranging surface 50 of the electronic device 5 is formed with installation holes 500 with an amount according to the required functional modules 2 so as to allow the interface plates 221 of the functional modules 2 to be mounted in the installation holes 500, thereby allowing the functional elements 21 to be externally disposed. Because each of the functional modules 2 can be freely selected and arranged, the required functional modules 2 and arranged locations thereof can be rapidly disposed according to actual needs of a product, thereby achieving an objective of customizing.

Figure 5:
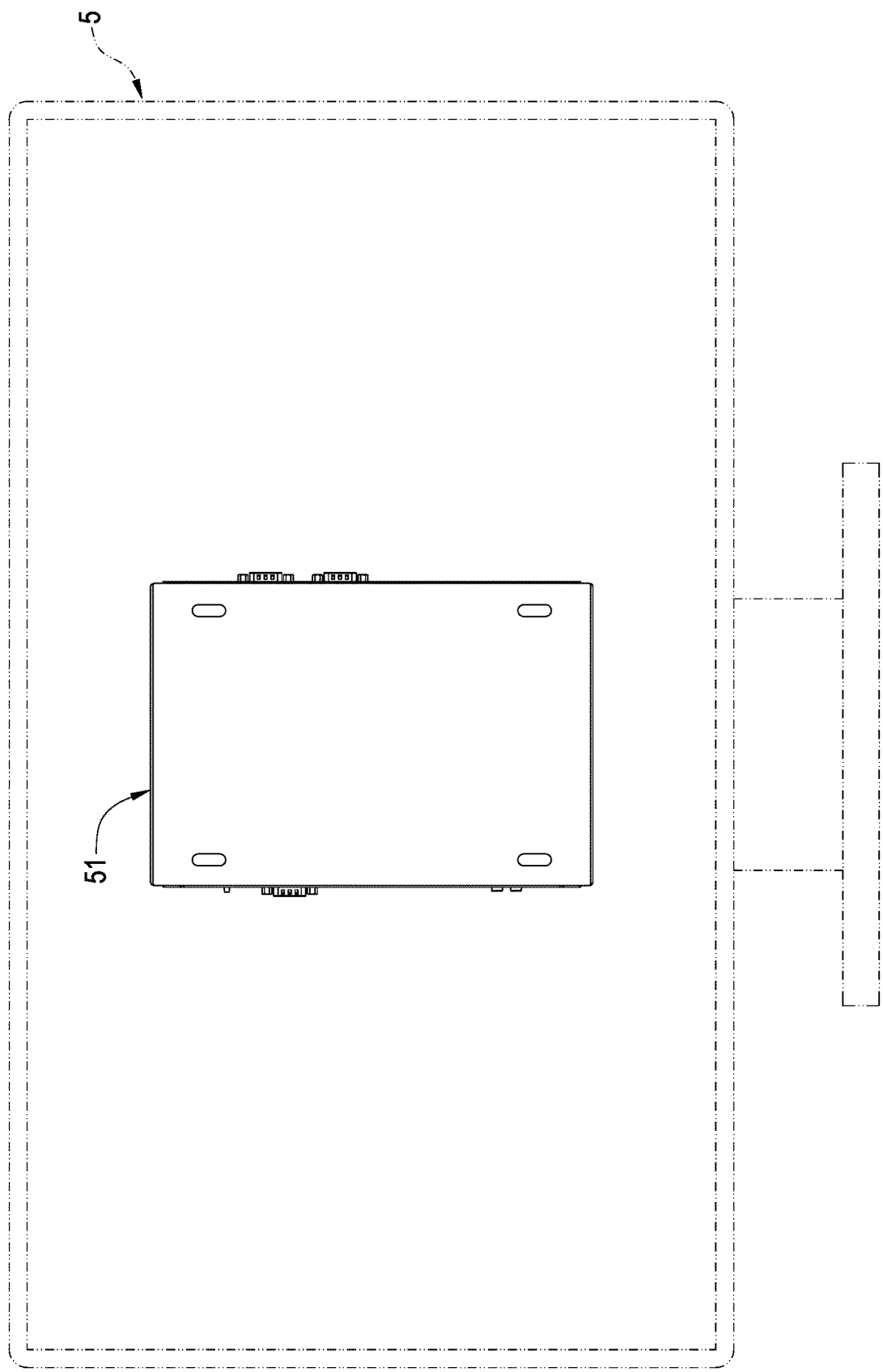
FIG. 5 is a schematic view showing an operating status of the present invention being applied in another electronic device.
Figure 6:
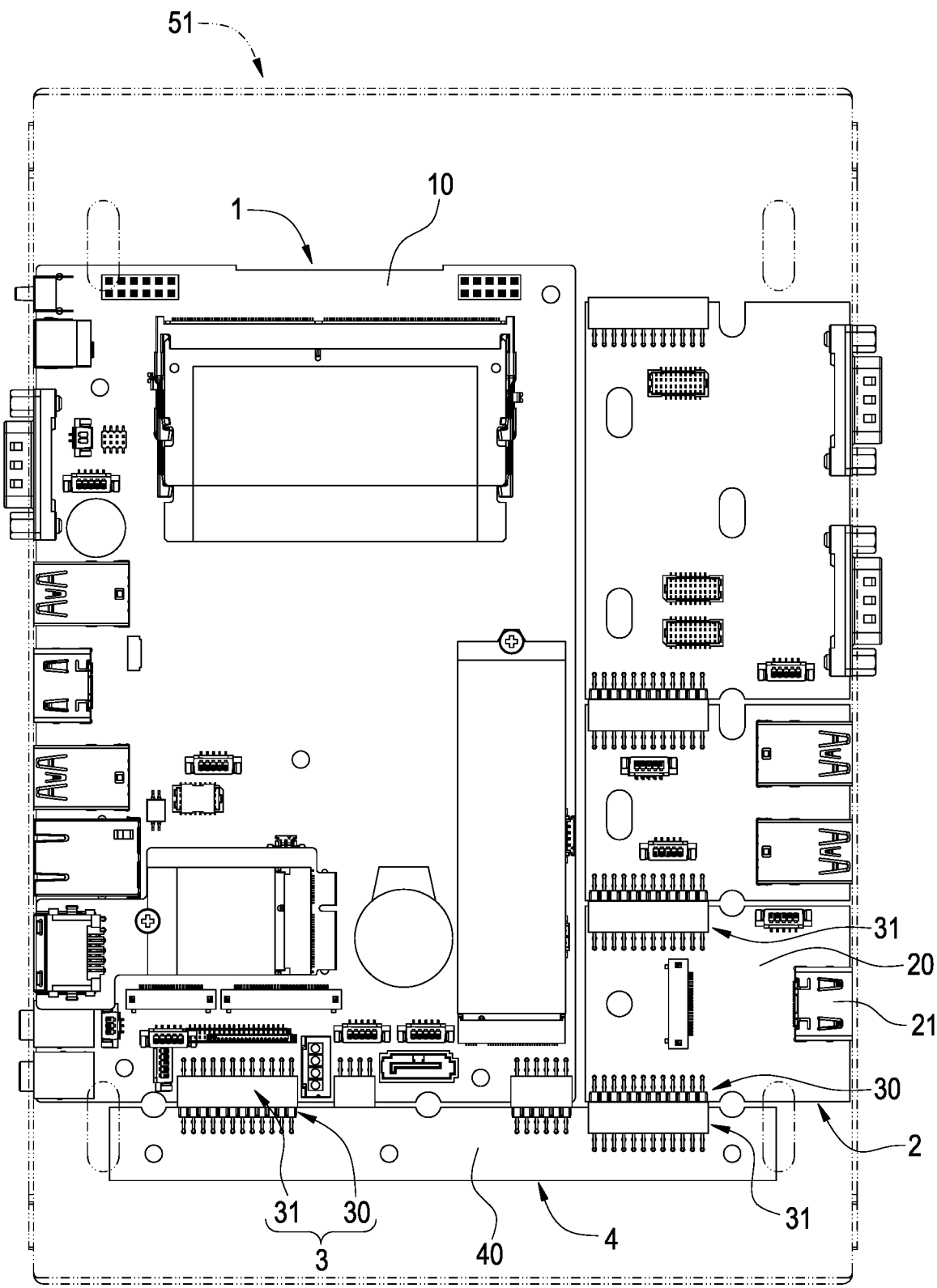
FIG. 6 is a schematic view showing an internal structure of the present invention being applied in another electronic device.

Please refer to FIG. 5 and FIG. 6, the present invention can also be applied in a control panel 51 of the electronic device 5, for example a display screen, and each of the functional modules 2 can be used for expanding the main system 1 of the display screen so as to provide required external connecting ports. Moreover, the present invention can also be applied for connecting the two different mother boards 10, so that the two mother boards 10 can be provided with an advanced expanding function after being expanded according to different requirements.

Although the present invention has been described with reference to the foregoing preferred embodiment, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. An interface system for a functional module, the interface system comprising:
    a main system, comprising a mother board; and
    a plurality of functional modules, each of the functional modules comprising a circuit board and at least one functional element disposed on the circuit board, wherein the functional element of each of the functional modules is an element with various functions or specifications;
    wherein, an expansion assembly is disposed between the mother board of the main system and the circuit board of any of the functional modules, the expansion assembly is disposed between the circuit boards of each of the functional modules, and each of the expansion assemblies comprises an input connector and an output connector, the input connector and the output connector are mutually engaged by a plurality of and the same amount of pins disposed respectively on the input connector and the output connector, the main system is selectively and electrically connected to the functional modules through each of the expansion assemblies to be connected extendedly,
    wherein each of the functional modules further comprises a carrier, the carrier comprises a carrying plate on which the circuit board is stacked, and an interface plate arranged in a vertical manner relative to the carrying plate and the functional element is exposed on the interface plate.

2. The interface system for the functional module according to claim 1, wherein the functional element of each of the functional modules is a connector, a control button or a light emitting diode element.

3. The interface system for the functional module according to claim 1, wherein the interface plate comprises a hole, the functional element is exposed from the hole.

4. The interface system for the functional module according to claim 1, wherein the carrying plate comprises a protruding point disposed on a side of the carrying plate, the functional modules are arranged side-by-side and contact with each other through the protruding point.

5. The interface system for the functional module according to claim 1, wherein a turning plate is further disposed between the mother board of the main system and the circuit board of the functional module.

6. The interface system for the functional module according to claim 1, wherein the turning plate comprises an engaging circuit board, and the expansion assembly is further disposed between the engaging circuit board and the mother board of the main system and disposed between the engaging circuit board and the circuit board of any of the functional modules.

7. A functional module, selectively and electrically connected to a main system, the functional module comprising:
    a circuit board; and
    at least one functional element, disposed on the circuit board;
    wherein an expansion assembly is disposed on the circuit board, the expansion assembly comprises an input connector and an output connector, the input connector and the output connector are mutually engaged by a plurality of and the same number of pins disposed respectively on the input connector and the output connector, the expansion assembly and the main system are connected for expansion, wherein the functional module further comprises a carrier, the carrier comprises a carrying plate on which the circuit board is stacked, and an interface plate arranged in a vertical manner relative to the carrying plate and the functional element is exposed on the interface plate.

8. The functional module according to claim 7, wherein the functional element of each of the functional modules is a connector, a control button or a light emitting diode element.

9. The functional module according to claim 7, wherein the interface plate comprises a hole, the functional element is exposed from the hole.

10. The functional module according to claim 7, wherein the carrying plate comprises protruding point disposed on a side of the carrying plate, the functional modules are arranged side-by-side and contact with each other through the protruding point.

* * * * *